(12) United States Patent
Xing

(10) Patent No.: US 10,297,779 B1
(45) Date of Patent: May 21, 2019

(54) OLED DISPLAY DEVICE AND PROCESS FOR MANUFACTURING THE SAME

(71) Applicant: Wuhan China Star Optoelectronics Technology Co., Ltd., Wuhan, Hubei (CN)

(72) Inventor: Lei Xing, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/744,819

(22) PCT Filed: Nov. 20, 2017

(86) PCT No.: PCT/CN2017/111884
§ 371 (c)(1),
(2) Date: Jan. 14, 2018

(30) Foreign Application Priority Data

Oct. 30, 2017 (CN) .......................... 2017 1 1034229

(51) Int. Cl.
*H01L 51/00* (2006.01)
*H01L 51/50* (2006.01)
(Continued)

(52) U.S. Cl.
CPC ........ *H01L 51/5203* (2013.01); *G02F 1/1334* (2013.01); *H01L 51/0032* (2013.01);
(Continued)

(58) Field of Classification Search
None
See application file for complete search history.

(56) References Cited

U.S. PATENT DOCUMENTS

| 8,680,766 B2* | 3/2014 | Matsuzaki .......... H01L 51/5256 313/504 |
| 2015/0378189 A1* | 12/2015 | Kim .................... H01L 51/5268 349/86 |

(Continued)

FOREIGN PATENT DOCUMENTS

JP    2006-276089 A    10/2006

OTHER PUBLICATIONS

Scoponi, Marco & Rossetti, Stefano. (2006). Photopolymerization kinetics of UV curable systems for polymer dispersed liquid crystal. 321-341.*

(Continued)

*Primary Examiner* — J. E. Schoenholtz
(74) *Attorney, Agent, or Firm* — Hauptman Ham, LLP

(57) ABSTRACT

The disclosure provides an OLED display device and a process for manufacturing the same, wherein the OLED display device includes a substrate, a first electrode, an organic functional layer, a second electrode, a polymer dispersed liquid crystal (PDLC) layer, and an upper electrode stacked in sequence, wherein the first electrode is an opaque electrode, and the second electrode is a semi-transparent electrode, and a micro-cavity structure consists of the first electrode, the organic functional layer, and the second electrode. The disclosure implements anti-peeping function and ensures the privacy of the display contents of the OLED display device while doing no harm to the organic functional layer. The disclosure also ensures that the display contents of the OLED display device can be dearly seen in a variety of angle.

13 Claims, 4 Drawing Sheets

(a) OLED display device (b) all-medium cavity

(51) Int. Cl.
   *H01L 51/52*   (2006.01)
   *H01L 51/56*   (2006.01)
   *G02F 1/1334*  (2006.01)
(52) U.S. Cl.
   CPC ...... *H01L 51/5092* (2013.01); *H01L 51/5262* (2013.01); *H01L 51/56* (2013.01)

(56) References Cited

U.S. PATENT DOCUMENTS

2016/0042702 A1* 2/2016 Hirakata ............ H01L 27/3269
                                                            345/205
2017/0351141 A1* 12/2017 Kubota ............ G02F 1/133305
2018/0102383 A1* 4/2018 Kim .................... H01L 27/1225

OTHER PUBLICATIONS

Maria Catarina Coutinho Varela da Silva, "Effect of Surfactant on PDLC Films with and without Permanent Memory Effect", Dissertation, Faculdade de Ciências e Tecnologia and Universidade Nova de Lisboa, Sep. 2013.*

Maheswari, U, "Optical and Dielectric Properties of Liquid Crystals and Liquid Crystal Nanocomposites", Project Report Anna University of Technology, Coimbatore-641047, May 2011.*

Park, Hongkyu, et al. "Evaluating Liquid Crystal Properties for Use in Terahertz Devices." Optics Express, vol. 20, No. 11, 2012, p. 11899., doi:10.1364/oe.20.011899.*

* cited by examiner (a) OLED display device    (b) all-medium cavity

OLED DISPLAY DEVICE AND PROCESS FOR MANUFACTURING THE SAME

RELATED APPLICATIONS

The present application is a National Phase of International Application Number PCT/CN2017/111884, filed on Nov. 20, 2017, and claims the priority of China Application 201711034229.7, filed Oct. 30, 2017.

FIELD OF THE DISCLOSURE

The disclosure relates to display, and more particularly to an OLED display device and process for manufacturing the same.

BACKGROUND

Organic light-emitting diode (OLED) has advantage such as self-emission, quick-response, wide view-angle, high brightness, low weight, low thickness, flexibility, etc., so its marketing development is expected and OLED becomes the mainly developed display technique in the next generation.

According to the light emission mechanism, the OLED display device can be classified as the bottom emission type and the top emission type. The light of the top emission OLED display device is emitted from the top, and such device structure can largely improve the aperture ratio of the display panel. The top emission OLED display device generally utilizes reflective metal bottom electrode and transparent or semi-transparent upper electrode. The transparent electrode is conventionally conductive metal oxide, but its high energy manufacture process damage to the organic layer and is harmful for keeping the device functionality. The semi-transparent upper electrode is conventionally thin metal layer, and the thin metal layer has thickness between 10 nm and 15 nm for keeping its conductivity. The thin metal layer with such thickness has certain light reflectivity and results in the micro-cavity effect. Because the brightness of the micro-cavity structure varies with the view angle, one next to the OLED display device cannot see the display contents and the privacy of the display contents is ensured. However, it results in the problem of view angle and harmful for keeping the display effect of the OLED display device. That is, the display contents of the OLED display device cannot be dearly seen in arbitrary angle.

SUMMARY

For solving the aforementioned problems, the disclosure provides an OLED display device and a process for manufacturing the same implement anti-peeping function and ensure the privacy of the display contents of the OLED display device while doing no harm to the organic functional layer. The disclosure also ensures that the display contents of the OLED display device can be dearly seen in a variety of angle.

The disclosure provides an OLED display device comprising a substrate, a first electrode, an organic functional layer, a second electrode, a polymer dispersed liquid crystal (PDLC) layer, and an upper electrode stacked in sequence, wherein the first electrode is an opaque electrode, and the second electrode is a semi-transparent electrode, and a micro-cavity structure consists of the first electrode, the organic functional layer, and the second electrode.

Preferably, the organic functional layer comprises at least one layer among a hole injection layer, a hole transmission layer, an emission layer, a hole block layer, an electron block layer, an electron transmission layer, and an electron injection layer.

Preferably, the first electrode comprises a first conductive thin film layer, an opaque metal layer, and a second conductive thin film layer stacked in sequence; wherein a material of the first conductive thin film layer is selected from the group consisting of ITO, IZO, ZnO, IGO, In2O3, AZO, and graphene; wherein a material of the second conductive thin film layer is selected from the group consisting of ITO, IZO, ZnO, IGO, In2O3, AZO, and graphene.

Preferably, a material of the second electrode is selected from the group consisting of silver, lithium, calcium, aluminum, magnesium, compound comprising lithium fluoride and calcium, compound comprising lithium fluoride and aluminum.

Preferably, an absolute value of a voltage difference between the first electrode and the second electrode is U and U is no less than zero and no larger than 100; wherein the first electrode acts as an anode, and the second electrode acts as a cathode, and the second electrode also acts as a bottom electrode of the PDLC layer.

The disclosure also provides a process for manufacturing OLED display device comprising: forming an opaque first electrode on a substrate; forming an organic functional layer on the first electrode; forming a semi-transparent second electrode on the organic functional layer; forming a polymer dispersed liquid crystal (PDLC) layer on the second electrode; and manufacturing an upper electrode on the PDLC layer, wherein a micro-cavity structure consists of the first electrode, the organic functional layer and the second electrode.

Preferably, the organic functional layer comprises at least one layer among a hole injection layer, a hole transmission layer, an emission layer, a hole block layer, an electron block layer, an electron transmission layer, and an electron injection layer.

Preferably, the first electrode comprises a first conductive thin film layer, an opaque metal layer, and a second conductive thin film layer stacked in sequence; wherein a material of the first conductive thin film layer is selected from the group consisting of ITO, IZO, ZnO, IGO, In2O3, AZO, and graphene; wherein a material of the second conductive thin film layer is selected from the group consisting of ITO, IZO, ZnO, IGO, In2O3, AZO, and graphene.

Preferably, a material of the second electrode is selected from the group consisting of silver, lithium, calcium, aluminum, magnesium, compound comprising lithium fluoride and calcium, compound comprising lithium fluoride and aluminum; wherein the step of forming the PDLC layer on the second electrode comprises: mixing and stirring liquid crystal material, acrylate oligomer, dilute monomer, photoinitiator, and interface active agent so as to obtain a transparent solution; coating the transparent solution on a surface of the second electrode by the roller coating process or the knife coating process; and curing the transparent solution on the surface of the second electrode so as to obtain the PDLC layer.

Preferably, the liquid crystal material is a dielectric positive liquid crystal material or a dielectric negative liquid crystal material.

The disclosure also provides a process for manufacturing OLED display device comprising: forming an opaque first electrode on a substrate; forming an organic functional layer on the first electrode; forming a semi-transparent second electrode on the organic functional layer; forming a polymer dispersed liquid crystal (PDLC) layer on the second electrode; and manufacturing an upper electrode on the PDLC layer; wherein a micro-cavity structure consists of the first electrode, the organic functional layer and the second electrode; wherein the organic functional layer comprises at least one layer among a hole injection layer, a hole transmission layer, an emission layer, a hole block layer, an electron block layer, an electron transmission layer, and an electron injection layer.

Preferably, the first electrode comprises a first conductive thin film layer, an opaque metal layer, and a second conductive thin film layer stacked in sequence; wherein a material of the first conductive thin film layer is selected from the group consisting of ITO, IZO, ZnO, IGO, In2O3, AZO, and graphene; wherein a material of the second conductive thin film layer is selected from the group consisting of ITO, IZO, ZnO, IGO, In2O3, AZO, and graphene.

Preferably, a material of the second electrode is selected from the group consisting of silver, lithium, calcium, aluminum, magnesium, compound comprising lithium fluoride and calcium, compound comprising lithium fluoride and aluminum; wherein the step of forming the PDLC layer on the second electrode comprises: mixing and stirring liquid crystal material, acrylate oligomer, dilute monomer, photoinitiator, and interface active agent so as to obtain a transparent solution; coating the transparent solution on a surface of the second electrode by the roller coating process or the knife coating process; and curing the transparent solution on the surface of the second electrode so as to obtain the PDLC layer.

Preferably, the liquid crystal material is a dielectric positive liquid crystal material or a dielectric negative liquid crystal material.

Implementing the disclosure has the following advantages. In the OLED display device in the disclosure, because the second electrode on the organic functional layer is a semi-transparent electrode, the damage to the organic functional layer in high energy process for manufacturing the second electrode is prevented. Further, because a micro-cavity structure is formed between the first electrode, the organic functional layer, and the second electrode, and there are PDLC layer and upper electrode disposed on second electrode, the PDLC layer may be transparent by controlling the voltage difference between the second electrode and the upper electrode so that the display contents of the OLED display device can be seen only in certain view angle and the OLED display device has the anti-peeping functionality.

By controlling the voltage difference between the second electrode and the upper electrode the liquid crystal in the PDLC layer may be controlled in a scattering mode. The emitted light with certain angle of the OLED display device is scattered into scattered status while passing through the PDLC layer and the certain emission angle is broken and the display contents can be seen in other view angles.

Hence, the OLED display device in the disclosure implements anti-peeping function and ensures the privacy of the display contents of the OLED display device. The OLED display device also ensures that the display contents of the OLED display device can be clearly seen in a variety of angle so as to implement the switch of the display states of the OLED display device.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
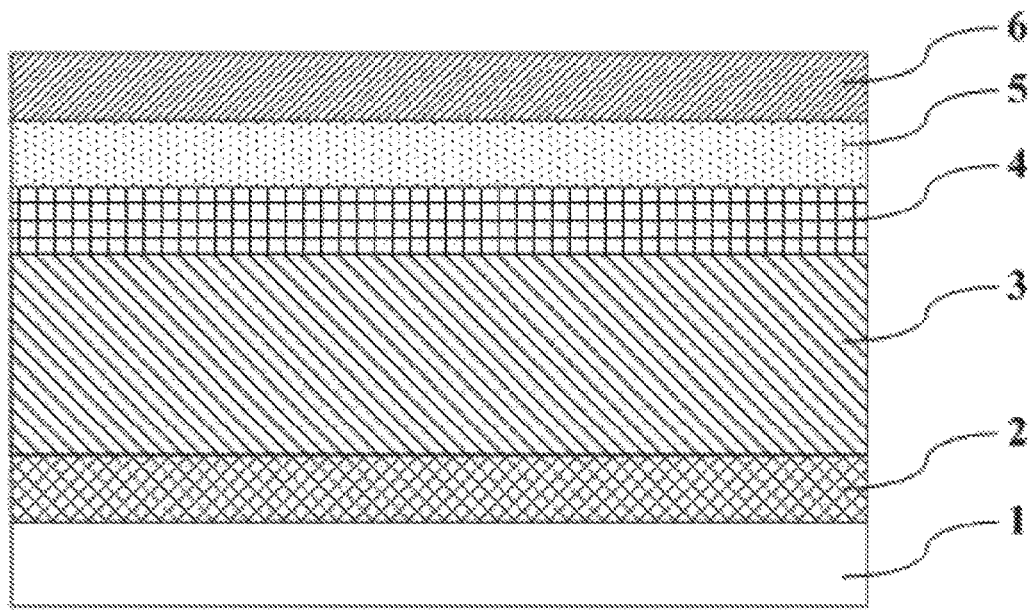
FIG. 1 is the structure of the OLED display device provided in the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

The disclosure provides an OLED display device, as shown in FIG. 1, the OLED display device includes a substrate 1, a first electrode 2, an organic functional layer 3, a second electrode 4, a polymer dispersed liquid crystal (PDLC) layer 5, and an upper electrode 6 stacked in sequence. The first electrode 2 is an opaque electrode, and the second electrode 4 is a semi-transparent electrode. A micro-cavity structure consists of the first electrode 2, the organic functional layer 3 and the second electrode 4 and has the micro-cavity effect. When the OLED display device works, an absolute value of a voltage difference between the first electrode 2 and the second electrode 4 is zero, which means the electric field strength between the first electrode 2 and the second electrode 4 is zero, or larger than zero. The OLED display device is a top emission OLED display device.

Figure 2:
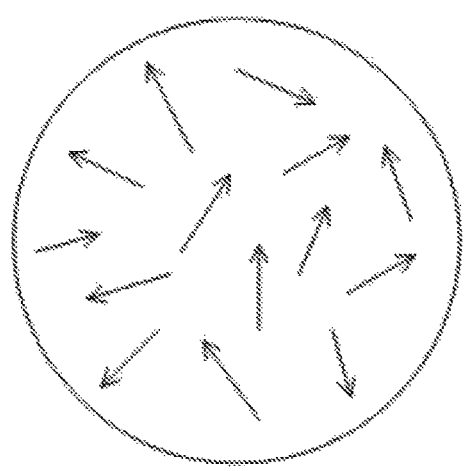
FIG. 2 is a schematic of the directions of the optical axes of the liquid crystals in polymer dispersed liquid crystal layer when electric voltage is not built for the PDLC layer.

The polymer dispersed liquid crystal (PDLC) is one kind of LC unit used in the liquid crystal display (LCD). The PDLC is an electric-optic responsive material obtained by mixing the liquid crystal oligomer and the prepolymer and evenly dispersing the polymerized micro-meter LC in the macromolecule net, which is a solid organic polymer body, and has the electric-optic responsive characteristic due to the dielectric differences in directions. The PDLC works in either scattering mode or transparent mode and has certain grayscale. As shown in FIG. 2, if the PDLC layer 5 is not charged with certain voltage, each of the liquid crystals in the PDLC layer 5 has its optical axis in a preferred direction so the optical axes of the liquid crystals are arranged disorderly. In FIG. 2, the arrow indicates the direction of the optical axis of one liquid crystal.

Figure 3:
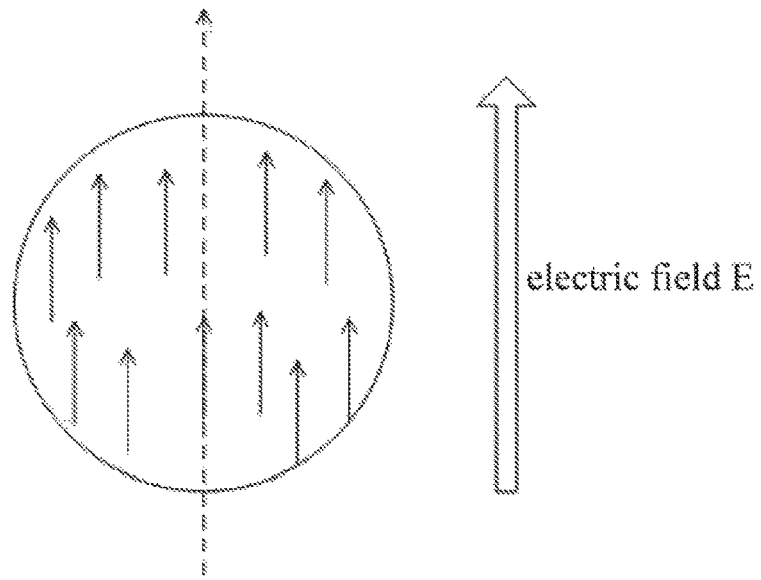
FIG. 3 is a schematic of the directions of the optical axes of the liquid crystals in polymer dispersed liquid crystal layer when electric voltage is built for the PDLC layer.

Because the liquid crystal is a material with optical and dielectric variation in direction, its effective refractivity does not match the refractivity of the body and the incident light is strongly scattered. As shown in FIG. 3, when the external electric field is built, the optical axes of the nematic liquid crystals are all along the direction of the electric filed. The arrow in FIG. 3 indicates the direction of the optical axis of the liquid crystal. The refractivity rate of the liquid crystal matches the refractivity of the body in certain ratio, light is capable of passing through the body and the body is transparent.

Figure 4:
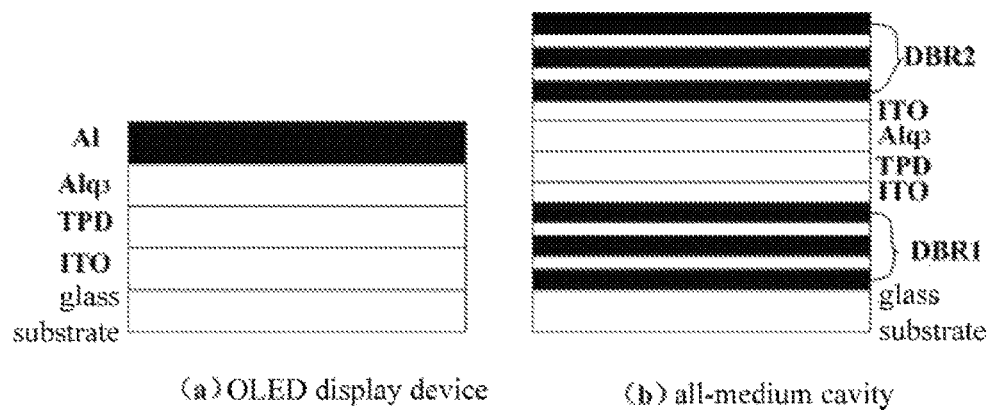
FIG. 4 is the structure of the OLED display device and its all-medium cavity provided in the disclosure.
Figure 5:
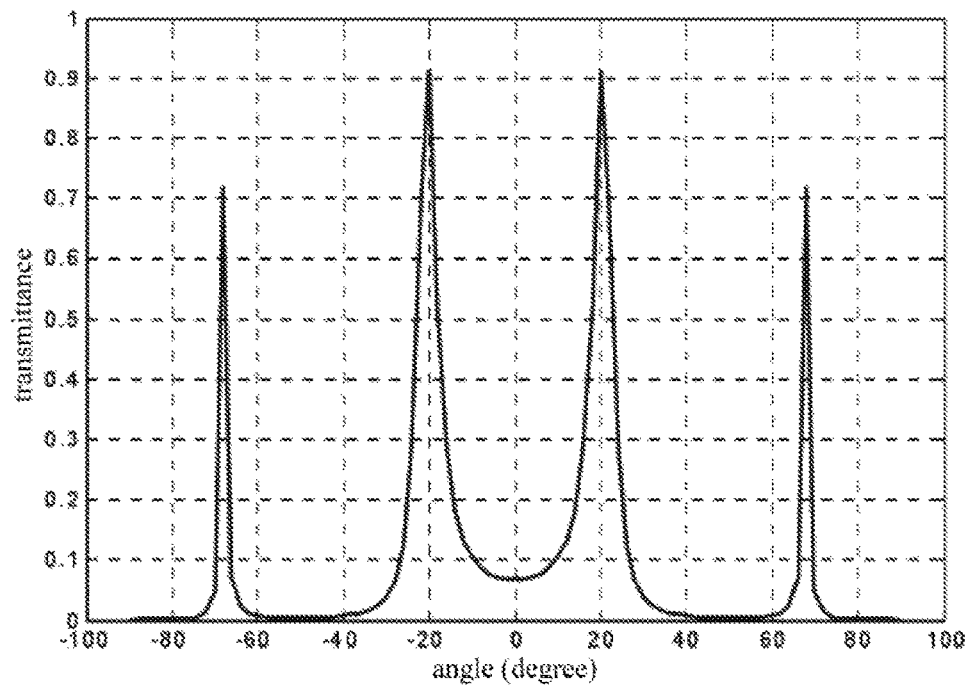
FIG. 5 illustrates a relationship between the transmittance of the all-medium cavity provided in the disclosure and the emission angle.

Generally, the micro-cavity structure of the OLED display device is such as all-medium cavity, all-metal cavity, and medium-metal cavity. Taking the OLED display device with all-medium cavity for example, the all-medium cavity is a micro-cavity structure that each of the anode and the cathode of the OLED display device has a distributed bragger reflector (DBR) as the DBR1 and the DBR2 in FIG. 4. The all-medium cavity, the same as the conventional OLED display device, takes TPD organic material as the hole transmission layer, Alq3 as the electron transmission layer and emission layer, and ITO thin film as the anode. The light emitted via the glass substrate, and the DBR's in both sides consist of periodical structures, TiO2 layer and SiO2 layer alternately arranged. The period may be adjusted based on the needs of experiment so as to obtain different reflectivity and the transmittance. The micro-cavity structure consisting of two DBR's has better characteristic compared with the micro-cavity structure consisting of one DBR in reflectivity and transmittance, in the aspect of peak strength or the bandwidth, so the structure is capable of improving the external quantum efficiency and monochromatic of the device. The reflection spectrum of the all-medium cavity has strong directionality, so when the wavelength of the light in the cavity reaches a certain number, as shown in FIG. 5, the emission phenomena can be observed in certain angle. The abscissa in FIG. 5 is the angle of the emitted light of the all-medium cavity, the viewing angle.

The micro-cavity structure is suitable for not only the bottom emission OLED display device, but the top emission OLED display device as well. The brightness of the conventional micro-cavity structure varies with the viewing angle, so the person next to the OLED display device cannot watch the display contents and the privacy of the display contents is ensured.

The working principle of the OLED display device in the disclosure is as follows:

When the privacy of the display contents is not necessary, the top emission OLED display device normally displays in wide view angle. The voltage at the upper electrode 6 of the PDLC layer 5 is controlled so the strength of the electric field between upper electrode 6 of the PDLC layer 5 and the bottom electrode of the PDLC layer 5, the second electrode 4, is zero. Then, there is no voltage difference between the upper electrode 6 and the bottom electrode, and the liquid crystals in the PDLC layer 5 are in scattering mode, and the PDLC layer 5 is in the off state. The emitted light of top emission OLED display device with certain angle is scattered when passing through the PDLC layer 5. The characteristic of the aforementioned top emission OLED display device is disturbed and one may clearly see the display contents in the view angle other than the certain emission angle. That is, the display contents can be seen in all angles.

Figure 6:
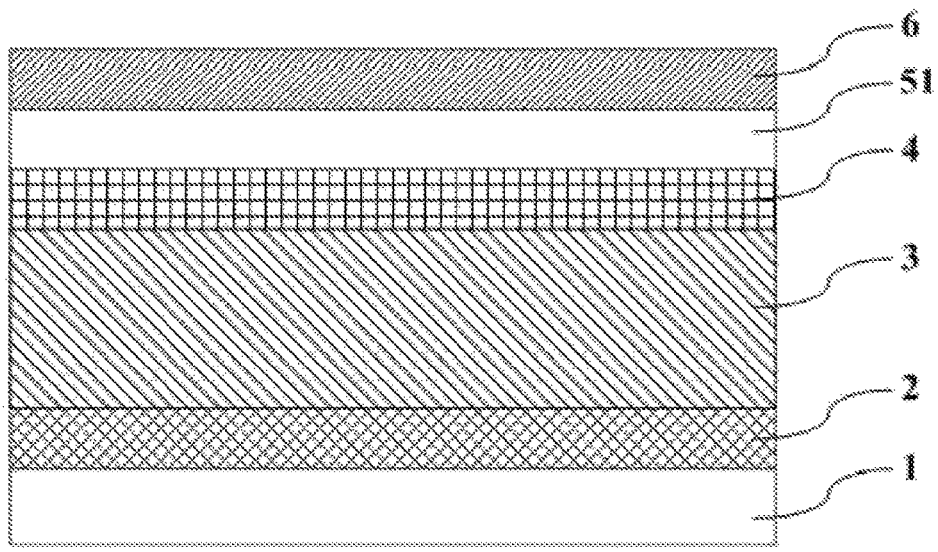
FIG. 6 is the structure of the OLED display device in anther embodiment of the disclosure when the electric voltage is built for the polymer dispersed liquid crystal layer.

In another embodiment, in the anti-peeping mode, the voltage at the upper electrode 6 of the PDLC layer 5 is controlled so that the voltage difference between the voltage at the upper electrode 6 and the bottom electrode of the PDLC layer 5, the second electrode 4, is kept constantly. For example, the absolute value of the constant voltage difference is selected between zero volt and 100 volts. The constant voltage difference must ensure that all liquid crystals in PDLC layer 5 are open, so the PDLC layer 5 is transparent. As shown in FIG. 6, the PDLC layer 5 is the liquid crystal layer 51 in the transparent mode. Hence, the display contents can be seen in certain view angle and the OLED display device has the anti-peeping functionality.

The micro-cavity effect is that the density of the photon in different energy state is rearranged, so only light with certain wavelength may be emitted in certain angle after complexed resonant cavity mode. The thickness L of the micro-cavity, which is the total optical thickness of the micro-cavity, and the peak wavelength in the emission spectrum of the micro-cavity meet the following relationship:

$$L=m*\lambda_m/2$$

Wherein m is the level of the emission mode, m is no less than one, and λ m is the wavelength of the level m mode.

According to the aforementioned description, the emission mode m and the emitted wavelength of the micro-cavity can be changed by adjusting the thickness of the micro-cavity so that the central wavelength of the electric-emission spectrum shifts and the emission efficiency changes. Accordingly, certain emission efficiency or certain view angle characteristic of the OLED display device may be achieved by adjusting the thickness of the micro-cavity.

Hence, the top emission OLED display device with certain view angle may be obtained by adjusting the thickness of the first electrode 2, the second electrode 4, and the organic functional layer 3, or by adjusting the reflectivity of the first electrode 2 and the second electrode 4.

In advance, the organic functional layer 3 comprises at least one layer among a hole injection layer, a hole transmission layer, an emission layer, a hole block layer, an electron block layer, an electron transmission layer, and an electron injection layer.

Figure 7:
FIG. 7 is the structure of the first electrode provided in the disclosure.

In advance, as shown in FIG. 7, the first electrode 2 comprises a first conductive thin film layer 21, an opaque metal layer 22, and a second conductive thin film layer 23 stacked in sequence.

Wherein a material of the first conductive thin film layer 21 is selected from the group consisting of ITO, IZO, ZnO, IGO, In2O3, AZO, and graphene;

Wherein a material of the second conductive thin film layer 23 is selected from the group consisting of ITO, IZO, ZnO, IGO, In2O3, AZO, and graphene.

The selected material is material with high work function, so the first electrode 2 and the organic functional layer 3 above have the energy level matched. It helps the carrier of the first electrode 2 to inject into the emission layer of the organic functional layer 3.

In advance, a material of the second electrode 4 is selected from the group consisting of silver, lithium, calcium, aluminum, magnesium, compound comprising lithium fluoride and calcium, compound comprising lithium fluoride and aluminum. These materials are metal with low work function and the thickness of the second electrode 4 is rather thin. It should be noted that the material of the second 1i electrode 4 may further comprise lithium fluoride while it comprises calcium or aluminum.

In advance, an absolute value of a voltage difference between the first electrode 2 and the second electrode 4 is U and U is no less than zero and no larger than 100 when the OLED display device works. The first electrode 2 acts as an anode of the OLED display device, and the second electrode 4 acts as a cathode of the OLED display device, and the second electrode 4 also acts as a bottom electrode of the PDLC layer 5.

Figure 8:
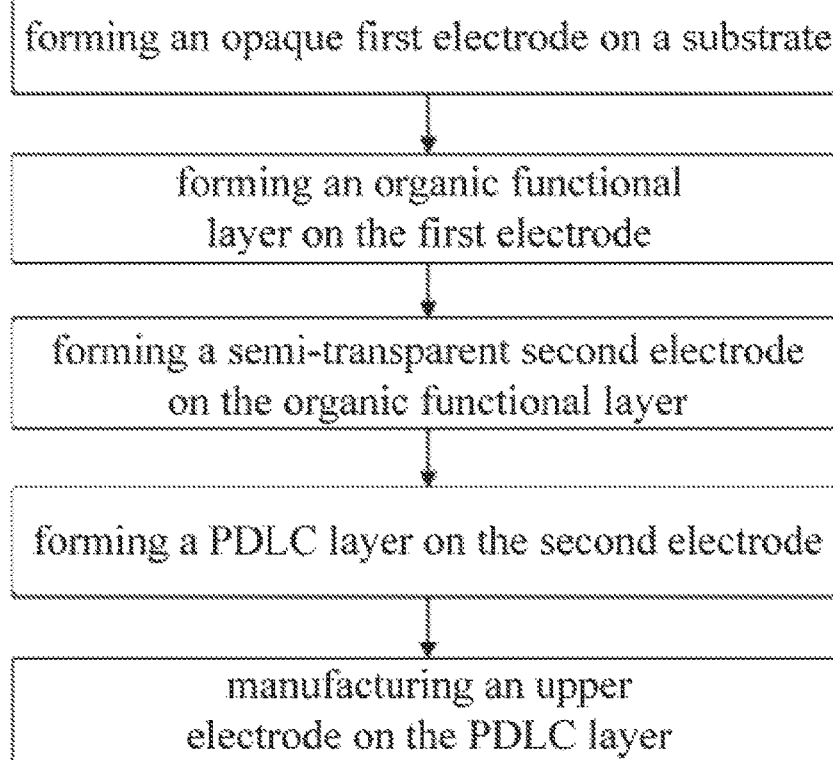
FIG. 8 is the flowchart of the process for manufacturing the OLED display device provided in the disclosure.

The disclosure also provides a process for manufacturing OLED display device, as shown in FIG. 8. The process comprises the following steps:

forming an opaque first electrode 2 on a substrate 1;

forming an organic functional layer 3 on the first electrode 2;

forming a semi-transparent second electrode 4 on the organic functional layer 3;

forming a polymer dispersed liquid crystal (PDLC) layer 5 on the second electrode 4; and manufacturing an upper electrode 6 on the PDLC layer 5.

Wherein a micro-cavity structure consists of the first electrode 2, the organic functional layer 3 and the second electrode 4.

In advance, the organic functional layer 3 comprises at least one layer among a hole injection layer, a hole transmission layer, an emission layer, a hole block layer, an electron block layer, an electron transmission layer, and an electron injection layer.

In advance, the first electrode 2 comprises a first conductive thin film layer 21, an opaque metal layer 22, and a second conductive thin film layer 23 stacked in sequence. A material of the first conductive thin film layer is selected from the group consisting of ITO, IZO, ZnO, IGO, In2O3, AZO, and graphene. A material of the second conductive thin film layer is selected from the group consisting of ITO, IZO, ZnO, IGO, In2O3, AZO, and graphene.

In advance, a material of the second electrode 4 is selected from the group consisting of silver, lithium, calcium, aluminum, magnesium, compound comprising lithium fluoride and calcium, compound comprising lithium fluoride and aluminum;

wherein the step of forming the PDLC layer 5 on the second electrode 4 comprises:

mixing and stirring liquid crystal material, acrylate oligomer, dilute monomer, photoinitiator, and interface active agent so as to obtain a transparent solution;

coating the transparent solution on a surface of the second electrode 4 by the roller coating process or the knife coating process; and curing the transparent solution on the surface of the second electrode 4 so as to obtain the PDLC layer 5.

In advance, the liquid crystal material is a dielectric positive liquid crystal material or a dielectric negative liquid crystal material.

As above, in the OLED display device in the disclosure, the second electrode 4 on the organic functional layer 3 is a semi-transparent electrode, so the damage to the organic functional layer 3 due to the high energy process in manufacturing the conductive metal oxide transparent electrode on the organic functional layer 3 can be prevented. Further, a micro-cavity structure consists of the first electrode 2, the organic functional layer 3, and the second electrode, and the PDLC layer 5 and the upper electrode 6 are manufactured on the second electrode 4, so the PDLC layer 5 can be controlled in the transparent mode by controlling the voltage difference between the second electrode 4 and the upper electrode 6, and the PDLC layer 5 is in ON state, so the display contents of the OLED display device can be seen only in certain view angle and the OLED display device has the anti-peeping functionality.

By controlling the voltage difference between the second electrode 4 and the upper electrode 6, the liquid crystals in the PDLC layer 5 can be controlled in the scattering mode and the PDLC layer 5 is in OFF state. The emitted light with certain angle of the OLED display device is scattered into scattered status while passing through the PDLC layer and the certain emission angle is broken and the display contents can be seen in other view angles.

Hence, the OLED display device in the disclosure implements anti-peeping function and ensures the privacy of the display contents of the OLED display device. The OLED display device also ensures that the display contents of the OLED display device can be clearly seen in a variety of angle so as to implement the switch of the display states of the OLED display device.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An OLED display device, comprising a substrate, a first electrode, an organic functional layer, a second electrode, a polymer dispersed liquid crystal layer, and an upper electrode stacked in sequence, wherein the first electrode is an opaque electrode, and the second electrode is a semi-transparent electrode, and a micro-cavity structure consists of the first electrode, the organic functional layer, and the second electrode, each of the first electrode and the second electrode of the OLED display device has a distributed Bragg reflector.

2. The OLED display device according to claim 1, wherein the organic functional layer comprises at least one of a hole injection layer, a hole transmission layer, an emission layer, a hole block layer, an electron block layer, an electron transmission layer, and an electron injection layer.

3. The OLED display device according to claim 1, wherein the first electrode comprises a first conductive thin film layer, an opaque metal layer, and a second conductive thin film layer stacked in sequence;
   wherein a material of the first conductive thin film layer is at least one selected from the group consisting of ITO, IZO, ZnO, IGO, In2O3, AZO, and graphene;
   wherein a material of the second conductive thin film layer is at least one selected from the group consisting of ITO, IZO, ZnO, IGO, In2O3, AZO, and graphene.

4. The OLED display device according to claim 1, wherein a material of the second electrode is at least one selected from the group consisting of silver, lithium, calcium, aluminum, magnesium, mixture of lithium fluoride and calcium, and mixture of lithium fluoride and aluminum.

5. A process for manufacturing OLED display device, comprising:
   forming a first distributed Bragg reflector on a substrate;
   forming an opaque first electrode on the substrate;
   forming an organic functional layer on the first electrode;
   forming a semi-transparent second electrode on the organic functional layer;
   forming a second distributed Bragg reflector on the semi-transparent second electrode;
   forming a polymer dispersed liquid crystal layer on the second distributed Bragg reflector; and
   manufacturing an upper electrode on the polymer dispersed liquid crystal layer;
   wherein a micro-cavity structure consists of the first distributed Bragg reflector, the first electrode, the organic functional layer, the second electrode and the second distributed Bragg reflector.

6. The process for manufacturing OLED display device according to claim 5, wherein the organic functional layer comprises at least one of a hole injection layer, a hole transmission layer, an emission layer, a hole block layer, an electron block layer, an electron transmission layer, and an electron injection layer.

7. The process for manufacturing OLED display device according to claim 5, wherein the first electrode comprises a first conductive thin film layer, an opaque metal layer, and a second conductive thin film layer stacked in sequence;
   wherein a material of the first conductive thin film layer is at least one selected from the group consisting of ITO, IZO, ZnO, IGO, In2O3, AZO, and graphene;
   wherein a material of the second conductive thin film layer is at least one selected from the group consisting of ITO, IZO, ZnO, IGO, In2O3, AZO, and graphene.

8. The process for manufacturing OLED display device according to claim 5, wherein a material of the second electrode is at least one selected from the group consisting of silver, lithium, calcium, aluminum, magnesium, mixture of lithium fluoride and calcium, and mixture of lithium fluoride and aluminum;
   wherein the step of forming the polymer dispersed liquid crystal layer on the second electrode comprises:
   mixing and stirring liquid crystal material, acrylate oligomer, dilute monomer, photo initiator, and surfactant to obtain a transparent solution;
   coating the transparent solution on a surface of the second electrode by a roller coating process or a knife coating process; and
   curing the transparent solution on the surface of the second electrode to obtain the polymer dispersed liquid crystal layer.

9. The process for manufacturing OLED display device according to claim 8, wherein the liquid crystal material is a positive dielectric anisotropy liquid crystal material or a negative dielectric anisotropy liquid crystal material.

10. A process for manufacturing OLED display device, comprising:
    forming a first distributed Bragg reflector on a substrate;
    forming an opaque first electrode on the substrate;
    forming an organic functional layer on the first electrode;
    forming a semi-transparent second electrode on the organic functional layer;
    forming a second distributed Bragg reflector on the semi-transparent second electrode;
    forming a polymer dispersed liquid crystal layer on the second distributed Bragg reflector; and
    manufacturing an upper electrode on the polymer dispersed liquid crystal layer;
    wherein a micro-cavity structure consists of the first distributed Bragg reflector, the first electrode, the organic functional layer, the second electrode and the second distributed Bragg reflector;
    wherein the organic functional layer comprises at least one of a hole injection layer, a hole transmission layer, an emission layer, a hole block layer, an electron block layer, an electron transmission layer, and an electron injection layer.

11. The process for manufacturing OLED display device according to claim 10, wherein the first electrode comprises a first conductive thin film layer, an opaque metal layer, and a second conductive thin film layer stacked in sequence;
    wherein a material of the first conductive thin film layer is at least one selected from the group consisting of ITO, IZO, ZnO, IGO, In2O3, AZO, and graphene;
    wherein a material of the second conductive thin film layer is at least one selected from the group consisting of ITO, IZO, ZnO, IGO, In2O3, AZO, and graphene.

12. The process according to claim 10, wherein a material of the second electrode is at least one selected from the group consisting of silver, lithium, calcium, aluminum, magnesium, mixture of lithium fluoride and calcium, and mixture of lithium fluoride and aluminum;
    wherein the step of forming the polymer dispersed liquid crystal layer on the second electrode comprises:
    mixing and stirring liquid crystal material, acrylate oligomer, dilute monomer, photo initiator, and surfactant to obtain a transparent solution;
    coating the transparent solution on a surface of the second electrode by a roller coating process or a knife coating process; and curing the transparent solution on the surface of the second electrode to obtain the polymer dispersed liquid crystal layer.

13. The process according to claim 12, wherein the liquid crystal material is a positive dielectric anisotropy liquid crystal material or a negative dielectric anisotropy liquid crystal material.

* * * * *